(12) United States Patent
Mollard et al.

(10) Patent No.: US 9,236,415 B2
(45) Date of Patent: Jan. 12, 2016

(54) DIODE MATRIX DEVICE WITH ENHANCED STABILITY

(71) Applicant: COMMISSARIAT A L'ENERGIE ATOMIQUE ET AUX ENE ALT, Paris (FR)

(72) Inventors: Laurent Mollard, Claix (FR); Nicolas Baier, Saint Nagaire les Eymes (FR); Johan Rothman, Grenoble (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 14/282,072

(22) Filed: May 20, 2014

(65) Prior Publication Data

US 2014/0346539 A1     Nov. 27, 2014

(30) Foreign Application Priority Data

May 24, 2013  (FR) ..................................... 13 01188

(51) Int. Cl.
*H01L 27/15* (2006.01)
*H01L 27/146* (2006.01)
*H01L 27/144* (2006.01)

(52) U.S. Cl.
CPC .......... *H01L 27/156* (2013.01); *H01L 27/1446* (2013.01); *H01L 27/1463* (2013.01)

(58) Field of Classification Search
CPC .......................... H01L 27/156; H01L 27/14643
See application file for complete search history.

(56) References Cited

U.S. PATENT DOCUMENTS

| | | | |
|---|---|---|---|
| 8,835,949 B2* | 9/2014 | Lee | 257/92 |
| 2010/0102336 A1* | 4/2010 | Lee et al. | 257/88 |
| 2011/0227091 A1 | 9/2011 | Toda | |

FOREIGN PATENT DOCUMENTS

| | | |
|---|---|---|
| EP | 1 677 353 A1 | 7/2006 |
| WO | WO 2013/079447 A1 | 6/2013 |

OTHER PUBLICATIONS

French Preliminary Search Report issued Jan. 15, 2014 in Patent Application No. FR 1301188.
J.M. Arias, et al., "MBE HgCdTe heterostructure p-on-n planar infrared photodiodes", Journal of Electronic Materials, vol. 22, No. 8, 1993, pp. 1049-1053.
M.A. Kinch, et al., "1/f noise in HgCdTe photodiodes", Journal of Electronic Materials, vol. 34, No. 6, 2005, pp. 928-932.
U.S. Appl. No. 14/359,216, filed May 19, 2014, Mollard, et al.
U.S. Appl. No. 14/361,177, filed May 28, 2014, Mollard, et al.
French Preliminary Search Report issued Jan. 15, 2014 in French Application 13 01188, filed on May 24, 2013 ( with English Translation of Categories of Cited Documents).
U.S. Appl. No. 14/705,078, filed May 6, 2015, Mollard, et al.

* cited by examiner

*Primary Examiner* — Fernando L Toledo
*Assistant Examiner* — Neil Prasad
(74) *Attorney, Agent, or Firm* — Oblon, McClelland, Maier & Neustadt, L.L.P.

(57) ABSTRACT

The invention relates to a device comprising a substrate supporting a matrix of diodes organized in rows and columns, and a peripheral substrate contact is arranged on at least one side of the matrix, characterized in that the substrate comprises one or several buried conducting lines having no direct electrical connection with the peripheral substrate contact and being positioned between at least two adjacent columns of diodes and between at least two adjacent rows of diodes.

12 Claims, 7 Drawing Sheets

DIODE MATRIX DEVICE WITH ENHANCED STABILITY

TECHNICAL FIELD

This invention relates to the field of diodes fabricated on semiconducting substrates and arranged as a matrix of diodes. More precisely, the invention deals with p/n or n/p type diodes that can be used for imagers in the visible or in the infrared.

STATE OF PRIOR ART

In many applications, diodes are arranged in diode matrices present on a substrate. In a matrix, diodes are arranged in rows and in columns.

A matrix of diodes may be used to detect electromagnetic radiation. Electron-hole pairs can be formed by interaction between electromagnetic radiation and the substrate. The result is the appearance of a current proportional to an intensity of incident radiation. Each diode then forms a pixel of an imager. Imagers in the visible range or infrared imagers can thus be fabricated.

Conversely, such a matrix can be used to emit electromagnetic radiation when a current passes in each diode so that the matrix forms an image. Each diode is then a pixel of a screen or a display, or a part of a pixel if each pixel is composed of several electromagnetic radiation emitters.

There are several types of arrangements depending on whether diodes are arranged locally with an order 4 axial symmetry or an order 6 axial symmetry.

FIG. 1A shows an order 4 arrangement of a matrix comprising diodes Di. Each diode Di is at the intersection of a row L and a column C that forms an angle of 90° with the row in the plane of the matrix. The diodes Di in one row L are in line with the diodes in another adjacent row L, thus forming columns C. In FIG. 1A, a line has been drawn around a row L0 and around a column C0, the diode denoted D0 is at the intersection of the highlighted row L0 and the highlighted column C0. This configuration is conventional and known, and is used for the description of the invention for simplification purposes. The diodes in a particular row L are separated from each other by a row pitch P1. The diodes in a particular column C are separated from each other by a column pitch P2. These pitches are qualified as row "majority" and column majority pitches, in opposition to one or more "extended" pitches introduced later. If the row majority pitch and the column majority pitch are approximately equal, then the term pixel pitch can be used instead of the previous two pitches.

FIG. 1B shows an arrangement of diodes in a matrix with an order 6 axial symmetry. In this example, the diodes D are arranged in rows L'. The diodes Di in one row L' are not aligned with the diodes in another adjacent row, but are offset from each other. Thus, a diode Di in one row L' is facing two diodes Di in an adjacent row L'. Such an arrangement means that columns of diodes Di are not formed, and instead a first diagonal H1 and a second diagonal H2 of diodes are formed at a given angle alpha between them in the plane of the matrix. In FIG. 1B, the first diagonals H1 are shown going from top left to bottom right, while the second diagonals H2 are shown going from bottom left to top right. Thus, diode reference D1 is at the intersection of a row L1 of a first diagonal H11 and a second diagonal H21 forming a given angle alpha between them. The given angle alpha may be approximately equal to 60°. The angle alpha is then the angle between the rows L' of the first and the second diagonals H1, H2.

This arrangement of diodes will not be described particularly in the remainder of this document. However, the invention can be applicable to it, the concepts of rows and columns in the remainder of the description then being replaced by the concepts of rows, and first and second diagonals.

A p/n, or n/p diode 10.0 as shown in FIG. 2 is present on a substrate 1.0 made of a semiconducting material. A distinction can be made in the substrate 1.0 between a first doped zone with a first type of doping formed by the majority of the substrate and a second doped zone 2.0 comprising a dopant forming a second type of doping, the second type of doping being opposite the first type of doping, which will be p or n for a p/n diode or a n/p diode respectively. In general, the second doped zone 2.0 is doped with a doping density that is several orders of magnitude higher than the dopant forming the first type of doping in the substrate 1.0. The second doped zone 2.0 forms a p/n junction or a n/p junction with the substrate 1.0. It will be considered that a diode 10.0 corresponds to the p/n junction, the second doped zone 2.0 and a substrate zone present around the second doped zone 2.0 and extending over at least a few nanometers.

A diode contact 34.0 at the centre of the doped zone 2.0 either supplies or collects any current circulating in the diode 10.0. The diode contact 34.0 comprises a foot 3.0 that is embedded in the second doped zone 2.0 and a head 4.0 that makes electrical contact between the foot 3.0 and an external electrical connection not shown.

A passivation layer 9.0 is usually present between the substrate 1.0, first and second doped zones combined, and the head 4.0 of the diode contact 34.0. Otherwise, there may be an electrical contact between the diode contact 34, the second doped zone 2.0 and the first doped zone of the substrate 1.0. This would short circuit the diode.

Regardless of whether the diode 10.0 is used in detection or in emission, a current must be able to circulate in it. Before the diode 10.0 can be polarised, a substrate contact 5.0 also has to be provided in part of the substrate external to the diode 10.0, in addition to the diode contact 34.0 present in the doped zone 2.0.

The substrate contact 5.0 will be connected to an external electrical circuit and is used to impose a polarisation of the diode 10.0. The diode contact 34.0 and the substrate contact 5.0 thus form two terminals of the diode 10.0.

When several diodes Di are arranged in a matrix, for example as shown in FIG. 3A, the substrate contact is usually around the periphery of the matrix 20 and is shared by all diodes Di of the matrix 20, and is then referred to as the peripheral substrate contact 5.1. For example, it might be a conducting line at the border of one, two, three or four sides of the matrix 20, if the matrix defines a rectangle or a square in the plane of the matrix. In this case, the peripheral substrate contact 5.1 is formed from a conducting line extending on two sides of the matrix 20.

The row majority pitch and the column majority pitch are assigned references P1 and P2 respectively.

FIG. 3B shows a sectional view along an axis AA' in FIG. 3A oriented along the direction of a column, in which only one diode D2 in the column is shown with part of the peripheral substrate contact 5.1. The diode D2 comprises a doped zone 2.0 present in the substrate 1.0 and a diode contact 34.0 penetrating into the doped zone 2.0. The diode contact 34.0 of the diode D2 is located at a given distance from the peripheral substrate contact 5.1, called the edge inter-contact distance L4. The diode contact 34.0 comprises a head projecting from a principal surface of the substrate 1.0 above the doped zone 2.0 and possibly above the substrate 1.0 and a foot penetrating into the doped zone 2.0. Furthermore, a dielectric layer 44 covers the substrate 1.0 and the heads of the diode contacts 34.0. Throughout the remainder of the invention, the passivation layer 9.0 is considered to be present even if it is not shown, unless specifically mentioned otherwise, for simplification reasons.

To use the diodes, they have to be polarised as already mentioned. The diode contact 34.0 is polarised by a read circuit (not shown) in contact with metallisation present above all diodes. A substrate polarisation is made by the read circuit on the peripheral substrate contact 5.1 present around the matrix.

The interface between the substrate 1.0 and the dielectric layer 44 is a key parameter in performance of the diodes. The diode performance is influenced by an interaction of minority carriers with defects forming shallow electronic states, that introduce carrier generation/recombination effects, or with deep electronic states that introduce charge effects in the dielectric layer.

Shallow electronic states induce generation/recombination of carriers present in a space charge zone that extends around the above mentioned p/n junction, giving rise to leakage currents.

The shallow electronic states that induce generation/recombination of carriers present outside said space charge zone form a higher diffusion dark current and cause a slower response of the diode.

Charge effects introduce a modulation of the interaction of carriers with electronic states inducing generation/recombination of carriers. This leads to modulation of the diode response and the dark current. This modulation introduces a time noise into the matrix, often of the 1/f type. Said modulation also introduces a variation in the mean response of diodes when the diode temperature varies during several usage cycles. This average response variation is also called cycling noise.

Charge effects may also induce a variation in the dimensions of the space charge zone, for example by moving the space charge zone further away on each side of the p/n junction. These variations in the space charge zone can also give rise to time noise, space noise and cycling noise as described in document "1/f noise in HgCdTe Photodiodes" by M. A. Kinch et al published in 2008 in *Journal of electronic Material*, volume 34, number 6, page 928 and subsequent pages.

In the case of photodiodes with a constant gap substrate, an attempt is made to reduce charge effects at the interface between the substrate and the dielectric layer by optimising doping present in the substrate and attempting to obtain a better quality dielectric layer.

However, these options are not very efficient and charge effects at the interface remain an important problem for efficient production of photodiodes.

Nevertheless the charge effect at the interface may be reduced by the use of hetero-structures in which a material with a larger gap that the remaining part of the substrate is used near the interface, as described in document "MBE HgCdTe Heterostructure p-on-n Planar Infrared Photodiodes", by J. M. Arias et al in 1993 in *Journal of electronic Material*, volume 22, number 8, page 1049 and subsequent pages. A larger gap can reduce interaction of minority carriers with the interface, which can reduce the generation/recombination of carriers.

However, these heterostructures remain sensitive to variations in the dimensions of the space charge zone, even if they are less sensitive there. Furthermore, the result of manufacturing heterostructures is usually to introduce additional defects at the interface between the substrate material and the material with a larger gap.

PRESENTATION OF THE INVENTION

The invention is aimed at stabilising the interface between the substrate and the dielectric layer by reducing charge effects. Charge effects are located at a principal surface of the substrate in which the diodes are located, or at an interface between the substrate and the dielectric layer covering the substrate and the diodes.

The invention is also aimed at reducing the interaction of minority carriers with the interface by the creation of a heterostructure following ion implantation. To achieve this, the invention relates to a device comprising a substrate supporting a matrix of diodes organised in rows and columns, and a peripheral substrate contact arranged on at least one side of the matrix. The substrate has a first type of doping and the diodes comprise a second doped zone with a second type of doping opposite the first type, in the substrate. The substrate also comprises several other doped zones, each forming a buried conducting line, these other doped zones having the first type of doping and a greater doping density than the substrate, the buried conducting lines having a gap greater than the gap of the substrate. The buried conducting lines have no direct electrical connection with the peripheral substrate contact, they are flush with a principal surface of the substrate on the side on which the diodes are present, are positioned between the second doped zones, extend between two adjacent columns of diodes and two adjacent rows of diodes, intersect at an intersection and form a mesh of buried conducting lines.

In this way, since they are conducting, the buried conducting lines enable a first action mode to stabilise the interface by reducing charge effects. Charge effects are located at a principal surface of the substrate in which the diodes are located, or at an interface between the substrate and the dielectric layer covering the substrate and the diodes.

The fact that the buried conducting lines have the same type of doping as the substrate and therefore opposite to the doping of the second doped zones of the diodes is advantageous. This enables a different action mode to stabilise said interface.

Remember that the gap of a material is defined as being the difference in energy between the top of the valency band and the bottom of the conduction band. For a degenerated semiconducting material, the conductivity and mobility of the carriers are of the same order of magnitude as for a metal.

In a degenerated semiconducting material, the Fermi level is located in a band between the conduction band and the valency band and the position depends on the doping. If the doping is of the n+ type, the Fermi level is located in the conduction band. An effective gap is defined as being the energy difference between the Fermi level located in the conduction band and the state corresponding to the direct transition in the valency band that as a first order of approximation may be considered to be at the top of the valency band. For a p+ doped material, due to the low curvature of the valency band, the gap and the effective gap can be considered to be the same as a first order of approximation. The semiconductor will not be degenerated if p+ doping is used. If n+ doping is used, the semiconductor will be considered to be degenerated for a doping density of more than $10^{17}$ carriers/$cm^3$.

In this invention, the term "gap" is used with its normal meaning given above for non-degenerated semiconducting materials and it encompasses the effective gap in the case of a degenerated semiconducting material, especially for n+ doped semiconducting materials.

If the buried conducting lines have a larger gap than the surrounding material, this creates a potential barrier at the buried conducting lines.

Preferably, the substrate is made of a semiconducting material based on HgCdTe. For example, for diodes formed in $Hg_{1-x}Cd_xTe$, a CdZnTe substrate will preferably be used on which there is a surface layer of $Hg_{1-x}Cd_xTe$.

In this case, with a substrate made of a semiconducting material with one or several chemical elements, one advantageous alternative is that the buried conducting line is composed of the same chemical element(s) as the substrate material and is doped with a doping element called the line dopant, of the same type as the substrate dopant with a higher doping level than the substrate dopant.

The line dopant is of the same type as the doping of the substrate. The line dopant may be present with a density of typically between $10^{15}$ and $10^{20}$ at/cm$^3$. This has several advantages. A first advantage is that there is no need for an etching step and that it is easy to implement. A second advantage is that it forms a potential barrier at the buried conducting line, in other words at the above mentioned surface, functioning as another action mode in order to reduce charge effects and stabilise said interface.

For n doping of buried conducting lines with a density of more than $10^{17}$ at/cm$^3$, the buried conducting line is made of a degenerated semiconducting material. In other words, the density of dopants in the buried conducting line is such that the conductivity and mobility of carriers in the semiconducting material is intermediate between the conductivity and mobility of the semiconducting material and a metal. Consequently, the material is no longer semiconducting and no longer has a gap but rather a so-called effective gap as was seen above.

Increasing the cadmium composition in an HgCdTe material increases the gap.

For p doping of buried conducting lines, zones with a second cadmium composition can be obtained by self-diffusion of cadmium in the buried conducting line, before a first cadmium composition with p+ type doping. A self-positioned heterostructure is then formed at all points with a p+ type doping, particularly in buried conducting lines.

If the substrate is made of an HgCdTe-based material, and if the buried conducting lines have "p" or "p+" type doping, the line dopant is advantageously arsenic. Arsenic in HgCdTe-based materials is a very good p type dopant. Conversely, if the buried conducting lines have "n" or "n+" type doping, the line dopant is advantageously boron. Boron in HgCdTe materials can be used to obtain n doping by ion implantation.

The buried conducting lines are formed preferably self-positioning, either for n doping or p doping of said buried conducting lines.

It will be understood that description given above, matrices can be formed in which doped zones of diodes and buried conducting lines form a self-positioned heterostructure with a second cadmium composition. The doped zones of diodes and buried conducting lines are separated by at least 0.5 micrometers in order to avoid creating a diode type junction between doped zones of diodes and buried conducting lines. Only one of the buried conducting lines and the doped zones can then be of the p+ type to enable the formation of self-positioned heterostructures. Then preferably, only buried conducting lines have the second cadmium composition.

Advantageously, the principal surface may be an interface between the substrate and a dielectric layer covering the diodes and the substrate as described above. In this way, being close to said surface or interface, it becomes easier for the buried conducting lines to have an influence in reducing and/or diffusing charge effects and stabilising said surface or interface.

A device according to the invention advantageously comprises a buried conducting line between two adjacent columns of diodes and/or two adjacent rows of diodes at least every k columns and/or m rows of the matrix, k and m may for example be equal to thirty, two or one. It is thus possible to form a matrix in which all diodes are at a buried inter-contact distance from a buried conducting line less than the critical inter-contact distance.

Advantageously, each buried conducting line present between two adjacent rows of diodes with a given length or between two adjacent columns of diodes with a given length, is the same length as or is longer than the length of said rows or said columns. The edge diodes are well stabilised if the length is strictly greater.

The buried conducting lines do not connect two contact branches of the peripheral substrate contact located on opposite sides of the matrix. They do not reach any of the contact branches of the peripheral contact.

The buried conducting lines have a length and a width defined in a plane containing the diodes, and the width is perpendicular to the length. In "15 μm pixel pitch" technology, the width is preferably between 0.5 μm and 5 μm.

The thickness of the buried conducting lines is defined approximately along a normal to a plane containing the diodes. In "15 μm pixel pitch" technology, the thickness is preferably between 0.5 μm and 2 μm.

BRIEF DESCRIPTION OF THE DRAWINGS

The invention will be better understood and other details, advantages and characteristics of it will become clearer after reading the following description given as a non-limitative example and with reference to the appended drawings in which.

Identical, similar or equivalent parts of the different figures have the same numeric references so as to facilitate comparison between the figures.

The different parts shown in the figures are not necessarily all at the same scale, to make the figures more easily readable.

Figures showing the different embodiments of the device according to the invention are given as examples and are in no way limitative.

DETAILED PRESENTATION OF PARTICULAR EMBODIMENTS

Figure 4A:
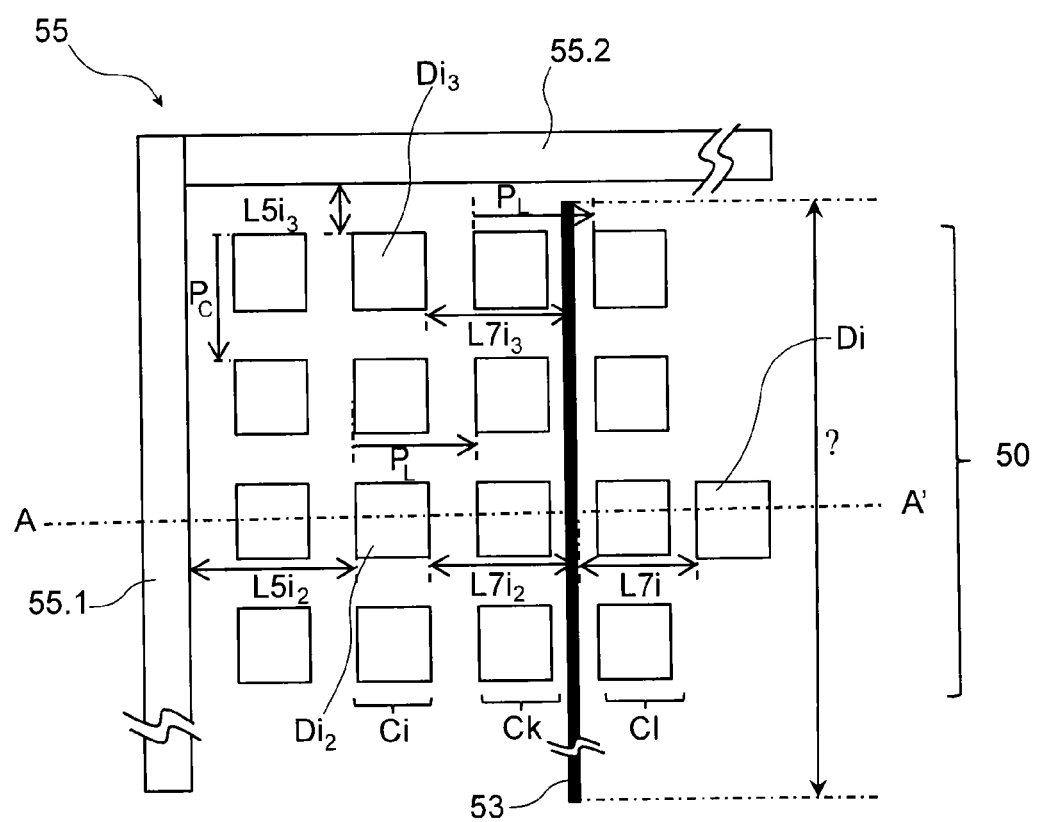
FIGS. 4A and 4B show a top view and a sectional view respectively of a diode matrix according to the invention comprising a buried conducting line between two columns of adjacent diodes.
Figure 4B:
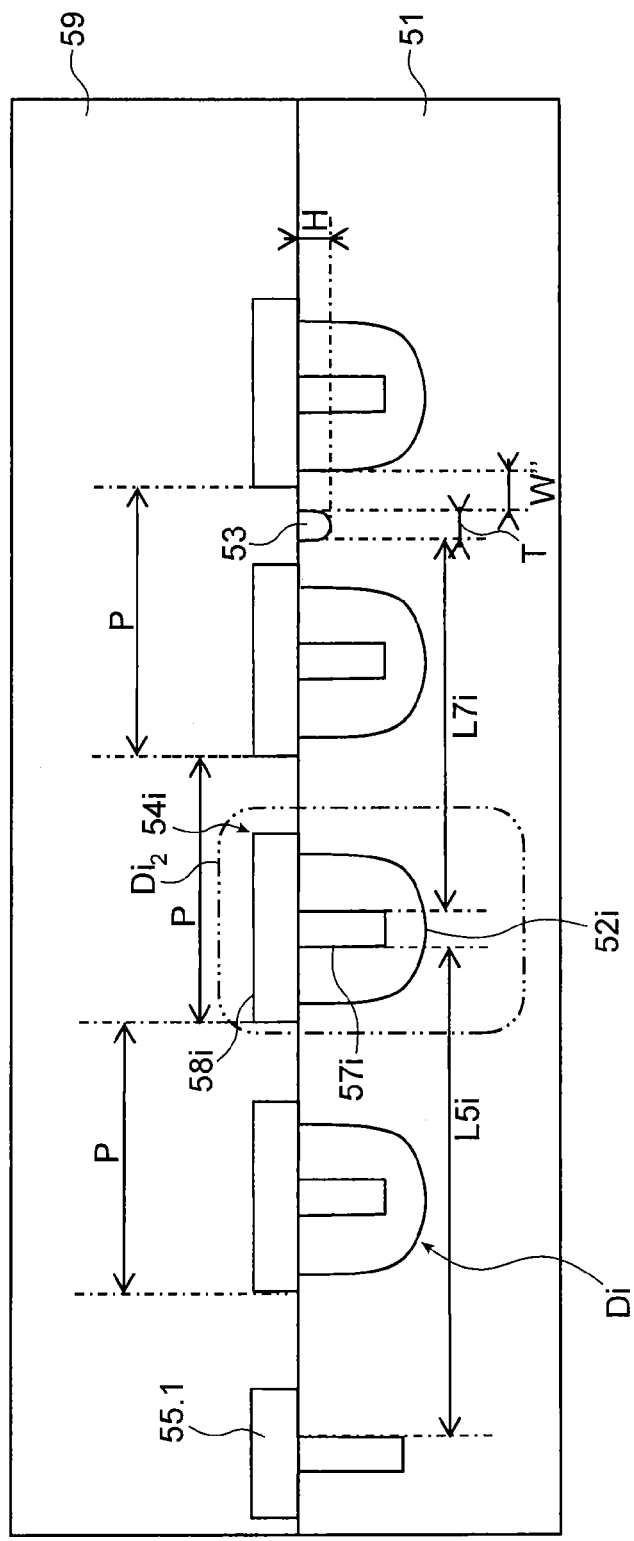

Firstly, the invention relates to a diode matrix like that described in FIGS. 4A and 4B.

FIG. 4A shows a top view of a matrix 50 of diodes Di. These diodes are arranged on a substrate shown without limits and are arranged in rows (Li) and columns (Ci, Ck, Cl). FIG. 4A shows seventeen diodes Di for simplification purposes, distributed in four rows and four columns plus one diode. However, the invention is valid for any arrangement and any number of diodes on several rows and several columns. Each diode has a diode contact on its surface that makes electrical contact between the diode Di and an electrical or electronic circuit not shown. FIG. 4A is a top view of the diode matrix 50 in which only diode contacts are shown because these are the only parts that project from a principal surface of the substrate. Diode contacts shown will be considered as equivalent to their corresponding diode Di in the top views for the remainder of the description, to facilitate understanding of the figure.

The diodes Di are arranged periodically in the matrix 50 with a majority row pitch $P_L$ in a particular row and with a majority column pitch $P_C$ in a particular column. Throughout the following description, for simplification reasons it will be assumed that the majority column pitch $P_C$ and the majority row pitch $P_L$ are approximately equal; their value will be referred to as the "pixel pitch P". However, if the row majority pitch and the column majority pitch are different, the invention will still be applicable as those skilled in the art will know how to apply the information provided in the invention to a matrix 50 in which the column majority pitch $P_C$ and the row majority pitch $P_L$ are different. Furthermore as mentioned above, the diodes may be arranged in first diagonals, in second diagonals and in rows rather than only in rows and columns. Those skilled in the art will find it easy to apply the information provided in the invention to such a matrix.

The matrix 50 comprises a peripheral substrate contact 55 around its periphery. In the example in this figure, it is composed of two contact branches 55.1, 55.2 that surround the matrix 50 on two successive sides. Alternately, the peripheral substrate contact 55 may comprise a single contact branch, three or four or more contact branches and thus surround the matrix 50 on the same number of successive, opposite or other sides.

It is considered that at least one diode Di in the matrix 50 is located at an edge inter-contact distance from every branch of the peripheral substrate contact 55.1, 55.2 greater than a critical inter-contact distance. The critical inter-contact distance is as was defined above. This means that at least one of the diodes Di is too far away from any contact branch 55.1, 55.2 for the diode to have acceptable performances during its use. For example, it could be a diode Di located in a central part of the matrix.

The invention does not use any nearby substrate contacts, to avoid defects caused by the use of close substrate contacts in prior art.

Instead of close substrate contacts, the invention proposes to insert a buried conducting line 53 in the substrate 51 between at least one first column Ck and an adjacent second column Cl, and/or between two adjacent rows of diodes in the matrix. This conducting line does not have any end in direct electrical contact with the peripheral substrate contact 55. This conducting line does not have direct electrical contact with the peripheral substrate contact 55. Furthermore, it has no direct electrical contact with any diode Di in the matrix 50, either at the diode contacts 51 or at the doped zones mentioned above, or with another electrical contact of the device.

The buried conducting line 53 is arranged buried in the substrate 51. It may be flush with the principal surface of the substrate 51. It means that a part of the buried conducting line 53 appears at the level of the principal surface of the substrate 51. Said principal surface may be an interface between the substrate 51 and an upper layer 59, for example made of a dielectric material. FIG. 4B shows this dielectric layer. The principal surface of the substrate is the surface on which the second doped zones emerge.

Diode contacts mentioned above are placed on said surface or principal interface.

If the buried conducting line 53 is located between two adjacent columns or two adjacent rows, it will have a length λ measured along the main direction of a column or row respectively.

Each diode Di in the matrix is said to be at a buried inter-contact distance L7i from the buried conducting line 53. In particular, two arbitrary diodes $Di_2$, $Di_3$ are referenced in FIG. 4A. They are at an edge inter-contact distance $L5i_2$, $L5i_3$ from the substrate contact 55 and at a buried inter-contact distance $L7i_2$, $L7i_3$ from the buried conducting line 53.

Figure 1A:
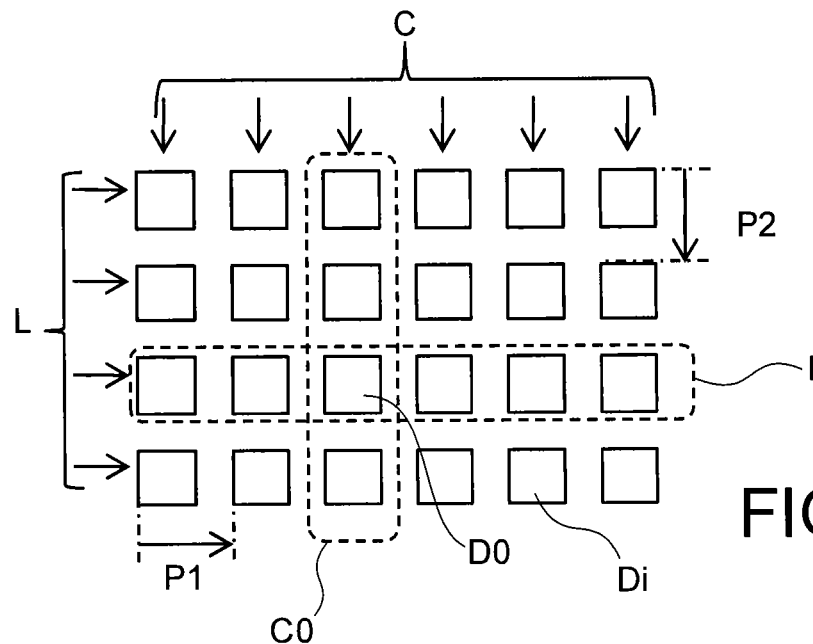
FIGS. 1A and 1B show two ways of arranging diodes in a matrix, either in rows or in columns, or with an order 3 axial symmetry.
Figure 1B:
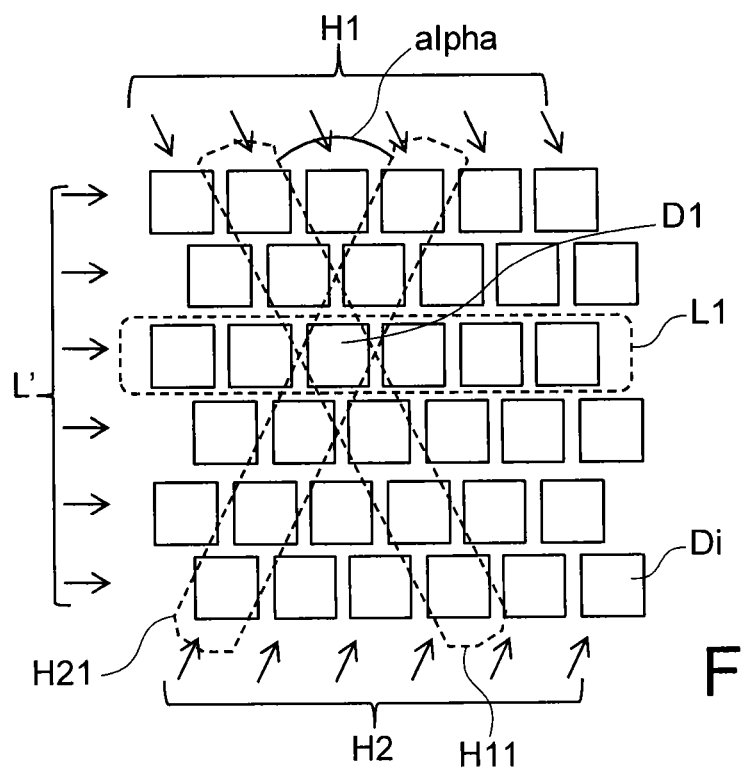
Figure 2:
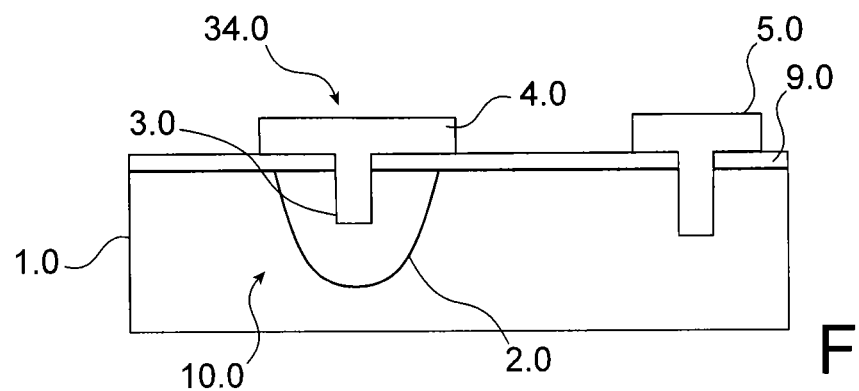
FIG. 2 is a diagram of a diode structure.
Figure 3A:
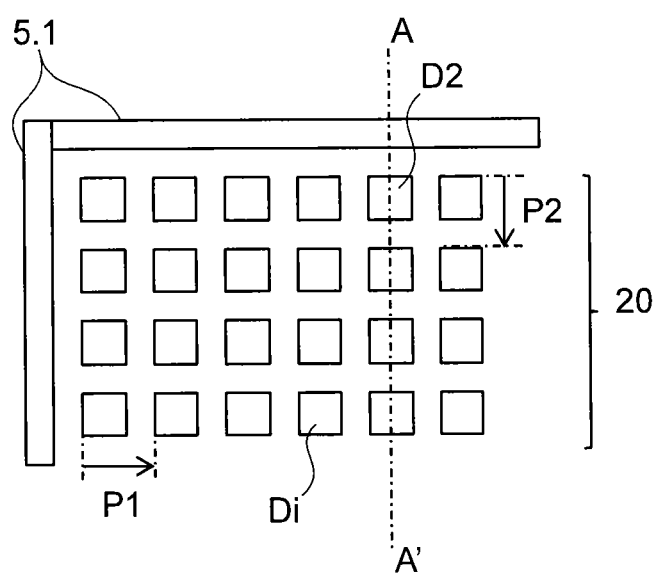
FIGS. 3A and 3B show a top view of a diode matrix and a sectional view along axis AA' of the diode matrix.
Figure 3B:
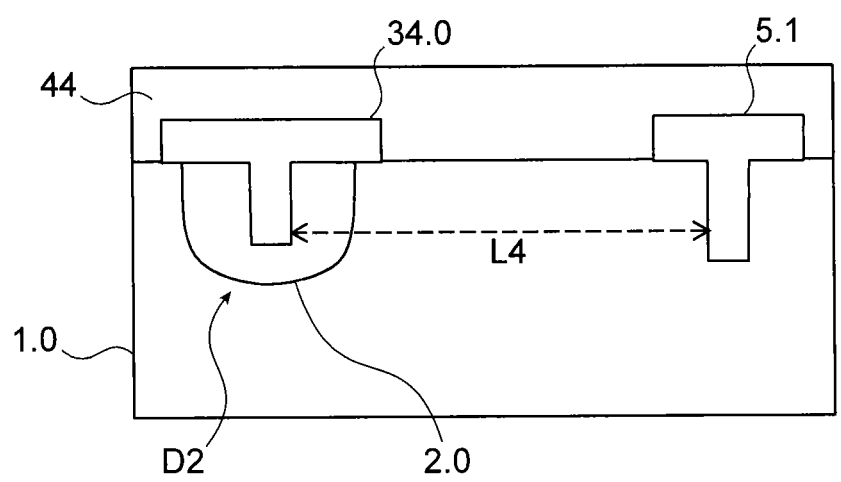

FIG. 4B is a sectional view of FIG. 4A along an axis AA', intersecting several diodes Di in the matrix 50 belonging to a single row. Each diode Di comprises at least a second doped zone 52i in the substrate 51 as described above with reference to FIG. 2. For simplification reasons, the second doped zone will be called "doped zone 52i" throughout the remainder of the description. The substrate 51 has a first type of doping and the second doped zones 52i have a second type of doping opposite the first type of doping.

The substrate is made of a semiconducting material. The substrate 51 may be made of HgCdTe such as $Hg_{1-x}Cd_xTe$ so that diodes and particularly diodes with optical properties can be fabricated.

Each diode Di also comprises a diode contact 54i composed of a foot 57i located inside the doped zone 52i and a head 58i located on the surface of the substrate 51. The head 58i is usually covered by the dielectric layer 59, so as to support electrical connections and interconnections not shown connecting the diodes Di to an external electronic circuit not shown.

FIG. 4B shows a section through the contact branch 55.1 of the peripheral substrate contact 55, at least part of which penetrates into the substrate 51. It also shows sections through four diodes, including diode reference $Di_2$, and a section through the buried conducting line 53. The buried conducting line 53 has a thickness H measured along an axis approximately perpendicular to a plane defined by the diodes Di. The buried conducting line 53 also has a width T measured approximately perpendicular to the thickness H and the length λ.

Each diode contact 54i is such that there is an edge inter-contact distance L5i between the foot 57i of the diode contact 54i and the peripheral substrate contact 55, in this case the contact branch 55.1. Furthermore, the foot 57i of each diode contact 54i is at a buried inter-contact distance L7i from the buried conducting line 53.

According to the invention, the buried conducting line 53 is separated from all doped zones 52i of diodes Di by a minimum distance W''. If this minimum distance W'' is too low, leakage currents can be formed between the doped zone 52i and the buried conducting line 53. No diode type junction is created between them. This distance W'' is at least 0.5 micrometers. The buried conducting lines are located between the second doped zones 52i.

The width T and the thickness H are preferably such that the buried conducting line 53 does not disturb the periodicity of the arrangement of diodes Di. It is then possible to insert the buried conducting line 53 between two rows and/or two columns of the matrix, in a space usually present between two adjacent diodes, without modifying the pixel pitch P of the matrix.

The thickness T and the height H of the buried conducting line 53 are also adapted such that the buried conducting line 53 occupies the largest possible volume in the space usually present between two adjacent diodes without forming any leakage currents with the diodes. The larger the section of the buried conducting line 53, the more it will stabilise the interface between the substrate 51 and the dielectric layer 59.

The width T and the thickness H of the buried conducting line 53 depend on the technology used to fabricate the matrix of diodes Di. An example of values of dimensions will be given for the so-called "15 µm pixel pitch" technology, in which the pixel pitch or majority pitch of the matrix is equal to approximately 15 µm for both the rows and the columns:

The width T of the buried conducting line 53 may be between 0.5 µm and 5 µm, for example 1 µm or 2 µm.

The thickness H of the buried conducting line 53 is approximately of the same order of magnitude as its width T, for example between about 0.5 µm and 2 µm.

Furthermore, in the "15 µm pixel pitch" technology, the diodes Di may have a diode contact head 58$i$ with a surface area of 10×10 µm², the doped zone 52$i$ may have a surface area equal to approximately 12×12 µm² in a plane parallel to a principal surface of the substrate.

The dimensions of the buried conducting line 53 will be adapted if the diode dimensions are different, either due to the use of a different microelectronic technology or due to a different application for the diodes.

In one preferred variant, the buried conducting line 53 is another doped zone in the substrate. It is composed of the same chemical element(s) as the semiconducting material of the substrate 51. Its doping is then the same type as the doping of the substrate 51. But the buried conducting line 53 is differentiated from the substrate 51 mainly in that it comprises a line dopant with a high doping density, higher than the doping present in the material of the substrate 51 by several orders of magnitude. The buried conducting line 53 is then defined as being in a volume containing the line dopant, but this volume does not have any direct electrical contact with the peripheral substrate contact 51. If a buried conducting line 53 is present between two adjacent diodes Di, it is the only conducting line located between the adjacent diodes, no other conducting lines are provided, in particular, no other conducting lines having the second type of doping.

The density of the line dopant in the semiconducting material forming the buried conducting line is typically between $10^{15}$ and $10^{20}$ at/cm³. For comparison, the density of the substrate 51 outside doped zones 52$i$ of the diodes Di is typically between $10^{14}$ and $10^{17}$ at/cm³.

If the line dopant is of the acceptor type, the result obtained is p+ type doping. If the line dopant is of the donor type, an n+ type doping will be obtained.

In some situations, the density of the n type line dopant may be more than $10^{17}$ at/cm³ such that the material of the buried conducting line 53 becomes degenerated. This means that the material of the substrate 51 that was initially semiconducting, acquires a behaviour intermediate between a semiconductor and a metal within the volume defining the buried conducting line 53 due to the presence of the dopant. In practice, the conductivity and mobility of the material from which the buried conducting line 53$a$ is made are then of the same order of magnitude but are lower than the conductivity and mobility of metals usually used in microelectronics.

In other situations, the doping density in the buried conducting line 53 is not sufficient to have a degenerated semiconducting material in the buried conducting line 53.

In the remainder of this description, a half-length of the buried conducting line 53 will be defined as being a distance between the diode furthest from any part of a peripheral substrate contact, and said substrate contact, measured along an axis on which a buried conducting line 53 may be located. If there are two contact branches placed on opposite sides of the matrix, the half-length will be approximately equal to half the distance separating these two contact branches.

Advantageously, the material in the buried conducting line 53 is different from the doped zone 52$i$ in that the row dopant and the dopant in the doped zone 52$i$ are of different types. Thus, depending on whether the doped zone 52$i$ comprises a p type dopant or an n type dope, advantageously the buried conducting line 53 will comprise a line dopant inducing n type doping or p type doping respectively.

In particular, if the substrate material is of the HgCdTe, or $Hg_{1-x}Cd_xTe$ type in the case of p/n diodes comprising a doped zone 52$i$ comprising a p type dope, the row dopant present in the buried conducting line 53 may be an n type dopant such as indium or boron. Conversely and using the same material for the substrate, in the case of n/p diodes comprising a doped zone 52$i$ comprising an n type dope, the line dopant may be of the p type such as arsenic or another.

A diode matrix can be fabricated in the state of the art such that the distance of each diode from a peripheral substrate contact or a close substrate contact is less than the critical inter-contact distance.

According to the information provided in the invention, a buried conducting line 53 can be placed between two adjacent rows and/or two adjacent columns. It is also possible to provide several buried conducting lines 53, each between two adjacent rows and/or two adjacent columns. If there is a buried conducting line between two adjacent rows and a buried conducting line between two adjacent columns at the same time, the two buried conducting lines will cross at an intersection and form a mesh of buried conducting lines.

A device according to the invention may comprise a buried conducting line between two adjacent columns of diodes and/or two adjacent rows of diodes, periodically every k columns and/or every m rows in the matrix. A second, third and fourth embodiment will be presented in the remainder of the description to illustrate this. In these different embodiments, the values of k and m are equal to each other and are equal to 30, 2 and 1 respectively. Obviously, it is possible that k and m could have different values. This is the case particularly if the values of the row pitch and the column pitch are different.

Figure 5:
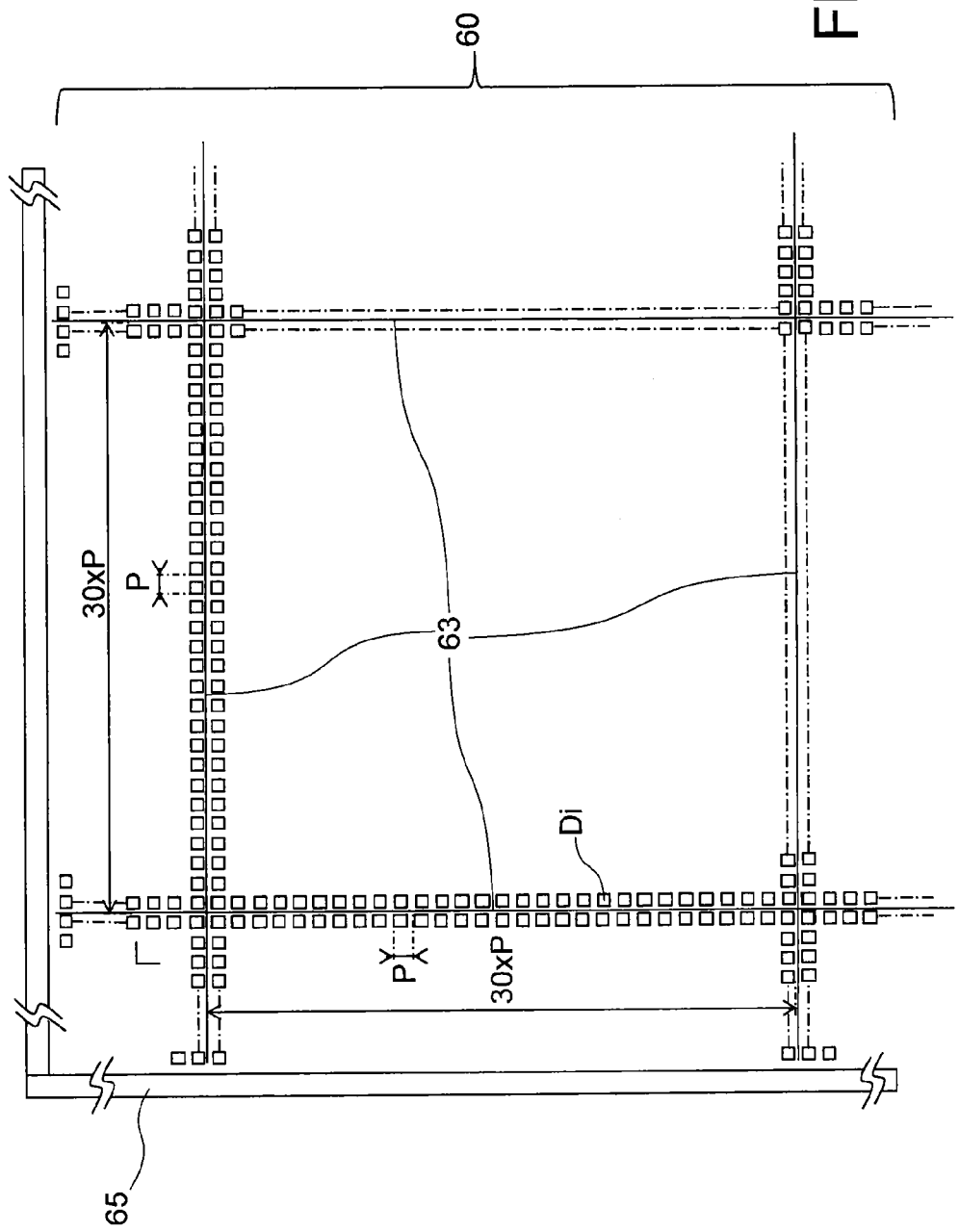
FIGS. 5, 6 and 7 show three examples of embodiments of the device according to the invention comprising several buried conducting lines located every k rows and m columns of diodes, where k and m have the same value in these examples, and are equal to 30, 2 and 1 respectively.

According to a second embodiment of the invention described in FIG. 5, there is a buried line 63 between two adjacent rows and/or two adjacent columns in a matrix 60, every 30 rows or 30 columns of the matrix. The length of such a buried conducting line is preferably greater than or equal to the length of adjacent rows and/or adjacent columns. Obviously, this length could be less than the length of adjacent rows and/or adjacent columns. When this length is greater than the length of adjacent rows and/or adjacent columns, the interface between all diodes is well stabilised. When this length is less than or equal to the length of the adjacent rows and/or adjacent columns, the edge diode interfaces might be unstable or poorly stabilised.

Taking account of a safety margin, the critical inter-contact distance may be estimated as being equal to a value close to fifteen times a value of the pixel pitch P using the 15 µm pixel pitch technology.

In this embodiment of the invention, the distance of each diode Di in the matrix 60 from a buried conducting line 63 is not more than 15 pixel pitches. Thus, each diode is at a buried inter-contact distance from a buried conducting line 63 less than the critical inter-contact distance.

Figure 6:
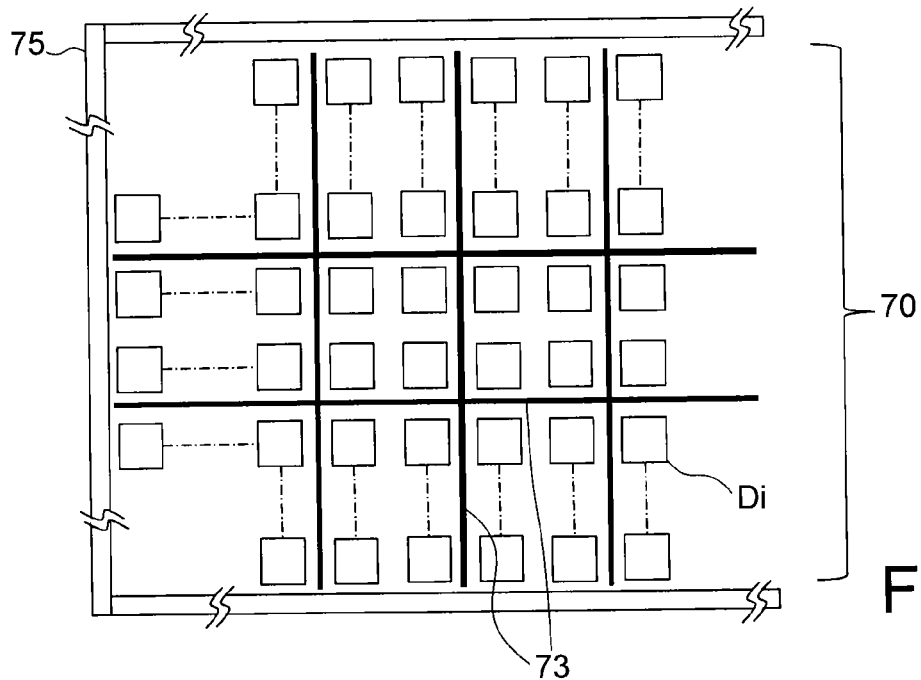

According to a third embodiment shown in FIG. 6, there is a buried line 73 in the matrix 70 extending between two adjacent rows and/or between two adjacent columns every two rows and/or two columns in the matrix. Furthermore, this figure shows three branches for the peripheral substrate contact 75. Two of the contact branches are located on opposite sides of the matrix 70. The buried conducting lines 73 are not electrically connected to any of these contact branches.

A potential difference applied between the diode contacts of the different diodes Di and a peripheral substrate contact 75 present at the matrix edge becomes equivalent to a potential difference applied between the diode contacts and adjacent buried conducting lines 73.

Since there is a buried conducting line 73 between two rows or between two columns every two rows and every two columns in the matrix, the diodes Di are surrounded by buried conducting lines 73 in sets of four. Therefore each diode Di in the matrix perceives an approximately identical electrical field output from the buried conducting lines 73, differing only by a 90° rotation.

Figure 7:
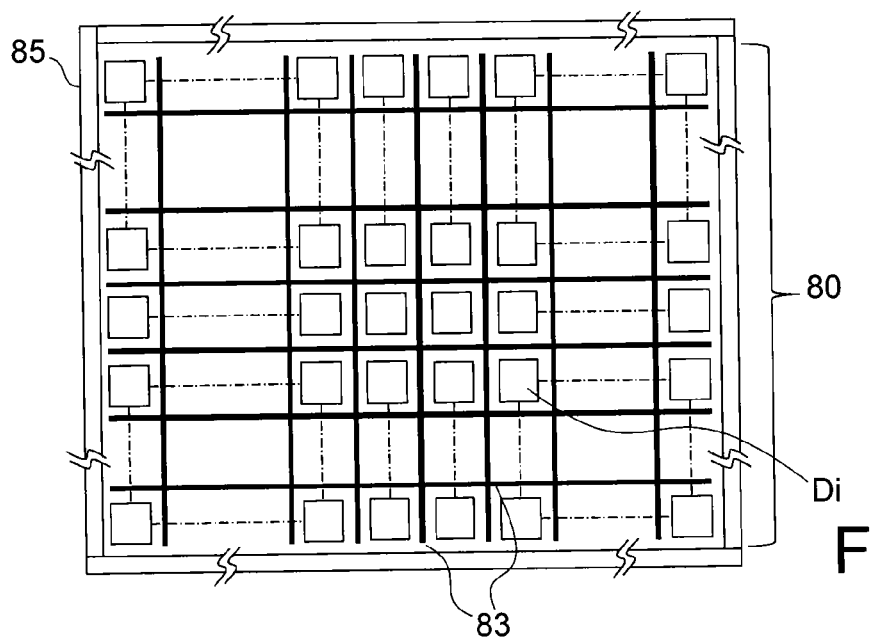

In a fourth embodiment shown in FIG. 7, there is a buried conducting line 83 between each row and each column in a matrix of diodes 80. The values of k and m are then equal to one.

Furthermore, in this figure, there are four contact branches for the peripheral substrate contact 85. The contact branches are located around the border of the matrix 80 and are arranged in pairs so as to border four opposite edges of the matrix in pairs.

In the invention, if the buried conducting lines do not have a first conductivity as defined in the invention, it will be preferred to have an arrangement of buried conducting lines 73, 83 according to the third and fourth embodiment of the invention shown in FIGS. 6 and 7 respectively. In these two embodiments, each diode Di considered is in the immediate vicinity of at least one buried conducting line 73, 83. In other words, at least one buried conducting line extends between said diode Di and at least one adjacent diode. In particular, in both of these embodiments, it is possible to have two or more buried conducting lines located in the immediate vicinity of each diode.

In the case of the fourth embodiment shown in FIG. 7, each diode Di is in the immediate vicinity of four buried conducting lines 83.

Furthermore, independently of the dopant density used in the buried conducting lines, the third and fourth embodiments of the invention improve stabilisation of the interface between the substrate and the dielectric layer superposed on the substrate. In the remainder of this description, the references in FIG. 4B will be applied to a case in which there are several buried conducting lines 53.

As presented above, the presence of the doped zones 52i in the different diodes Di close to the interface between the substrate 51 and the dielectric layer 59 superposed on the substrate, forms important charge effects at this interface.

When the buried conducting lines 53 are close to this interface and their doping density is high, of the same order of magnitude as the doping density in the doped zones of the diodes, or a higher order of magnitude, a potential barrier is formed at the interface between the substrate and the dielectric layer 59. This is the case for any buried conducting line 53 according to the invention composed of a doped semiconducting material, regardless of whether or not it is degenerated. Therefore there is a reduction in interactions between minority carriers and recombining states, which is a cause of stabilisation of the interface.

Furthermore, as announced above, the doping of the buried conducting lines 53 and the doped zone 52i of the diodes Di are of opposite types. The buried conducting lines 53 thus induce balancing of charges at the interface between the substrate 51 and the dielectric layer 59.

These two points lead to stabilisation of the interface and screening of charge effects. This means that space noise, time noise and cycling noise can be lower than can be obtained with a matrix according to the state of the art.

In the case of buried conducting lines 53 based on a semiconducting material doped with a line dopant, screening and charge balancing effects will increase with increasing width T and with increasing thickness H of the buried conducting line. The line dopant has a presence at the interface that depends on the dimensions of the buried conducting line 53 and the number of buried conducting lines 53 surrounding each diode Di.

In one special embodiment of the invention, if the substrate is a semiconducting material based on $Hg_{1-x}Cd_xTe$ with p type dopant and a given gap and a first cadmium composition x, it is advantageous that the buried conducting lines 53 are p+ doped with an acceptor type line dopant, for example arsenic. If the dopant present in the buried conducting line 53 is of the acceptor type, it is easy to form a self-positioned heterostructure with a composition in which the buried conducting lines 53 have a second cadmium composition higher than the first cadmium composition. The cadmium composition of the surface of the substrate or the interface between the substrate and the dielectric layer 58 then remains the same as it was at first.

The gap in an $Hg_{1-x}Cd_xTe$ material depends on the cadmium composition. Thus, in a device like that described above, the buried conducting lines 53 are made of a material with a larger gap than the gap of the substrate 51.

Formation of a gap in the buried conducting lines 53 larger than the gap in the remainder of the substrate 51 helps to reduce charge effects by adding a potential barrier that pushes carriers away from the interface.

A matrix of diodes with an HgCdTe substrate usually comprises a passivation layer, of which one of the elements is cadmium Cd located between the substrate and the dielectric layer.

If a self-positioned composition heterostructure is to be obtained for a p doped substrate, there must be a passivation layer of which one of the elements is cadmium Cd (not shown), deposited on the substrate, in contact with all p+ doped zones in which the cadmium composition is to be increased. A diffusion step is then carried out in particular including annealing, for example at a temperature of more than 100° C. for a duration of more than one minute. Selective diffusion of cadmium then takes place, from the passivation layer throughout the zone of the substrate 51 in contact with the passivation layer and with a p+ doping. The cadmium concentration and the gap are thus locally increased in these zones. If only the buried conducting lines are doped with a p+ type doping, selective diffusion is limited to a volume defined by the buried conducting lines 53.

Preferably, when a composition heterostructure is formed in the buried conducting lines 53, they are p+ doped and the doped zones 52i of the diodes Di are n or n+ doped such that only the buried conducting lines have a larger gap than the gap of the substrate 51.

If, alternately, p doped diodes Di without a composition heterostructure and buried conducting lines with a self-positioned composition heterostructure are required, then the passivation layer can be made from CdTe only at the buried conducting lines 53, in contact with them before performing the above-mentioned annealing. In other words, a passivation layer is deposited over the entire substrate except vertically in line with diodes Di, to avoid forming a self-positioned composition heterostructure at the diodes Di. It will then be necessary to passivate the diodes and the remainder of the substrate with a passivation layer, one of the elements of which is cadmium Cd. In this case, the diode contact may typically be fabricated after the heterostructures have been formed in the buried conducting lines 53.

However, if it is required to form a composition heterostructure in the doped zones 52$i$ of the diodes, then doped zones 52$i$ with p or p+ doping can be used. The buried conducting lines 53$i$ and the substrate have the same type of doping in the matrix. There is then a weaker balance of charges at the interface between the substrate and the dielectric layer.

When buried conducting lines with a first conductivity according to the invention are used, it is usually more advantageous to have buried conducting lines 53 made of a degenerated semiconducting material rather than metal. Metallic buried conducting lines 53 cannot lead to a local increase in the gap, nor to the formation of a potential barrier by balancing of charges at the interface between the substrate 53 and the dielectric layer 59.

It may even be considered to be more advantageous to have buried conducting lines made of a non-degenerated doped semiconducting material rather than one or several metals. Having a lower gain G but obtaining a larger noise reduction due to better stabilisation of the interface may be more advantageous than obtaining a higher gain G on the parasite resistance, but having weaker stabilisation of the interface if metallic buried conducting lines 53 are used.

The line dopant may have been introduced by ion implantation at a depth close to a required centre of the section of the buried conducting line 53, followed by annealing in order to diffuse the dope. One particular example is arsenic implantation at 500 keV at an implantation dose of $2\times10^{15}$ at/cm² followed by annealing at 400° C. for 5 hours.

Alternately, the line dopant may have been introduced by diffusion of the dopant in the material of the substrate 51. For example, this can be obtained by depositing a resin mask on the substrate 51. The resin mask is then photolithographed so as to have openings at the location at which it is required to form buried conducting lines.

The dopant is brought into contact with the substrate through openings present in the resin mask. A diffusion annealing is then done so as to make the dopant diffuse in the substrate 51 and form the buried conducting lines 53.

The dopant may be added in gas form or in solid form. If the dopant is present in solid form, it may be a layer of material deposited above the resin mask and in the openings. Such a material is removed following the diffusion annealing.

The invention claimed is:

1. Device comprising:
a substrate;
a matrix of diodes supported by said substrate and organised in rows (L) and columns (C);
a peripheral substrate contact arranged on at least one side of the matrix wherein the substrate having a first type of doping and the diodes (Di) comprising each a second doped zone in the substrate, having a second type of doping opposite the first type; and
several other doped zones, each forming a buried conducting line buried in the substrate such that top surfaces of the buried conducting lines are flush with a principal surface of the substrate on the side on which the diodes are present (Di), wherein the buried conducting lines:
have no direct electrical connection with the peripheral substrate contact,
are positioned between the second doped zone,
extend between two adjacent columns of diodes (Di) and two adjacent rows of diodes (Di), such that they intersect at an intersection and form a mesh of buried conducting lines, and
the buried conducting lines having the first type of doping and a greater doping density than the substrate and a gap greater than the gap of the substrate.

2. Device according to claim 1, wherein the substrate is made of a semiconducting material.

3. Device according to claim 2, wherein the substrate is made of a semiconducting material with one or several chemical elements, the buried conducting lines are composed of the same chemical element(s) as the semiconducting material of the substrate and are doped with a doping element called the line dopant present with a density between $10^{15}$ and $10^{20}$ at/cm³.

4. Device according to claim 3, wherein the buried conducting lines are made of a degenerated semiconducting material.

5. Device according to claim 3, wherein the substrate is made of an HgCdTe-based material and the line dopant is arsenic or boron depending on the doping type required in the buried conducting line.

6. Device according to claim 3, wherein the substrate is an HgCdTe-based material having a first cadmium composition between two adjacent diodes, and in which the buried conducting lines have a p-type doping and have a second cadmium composition higher than the first composition.

7. Device according to claim 1, wherein the principal surface is an interface between the substrate and a dielectric layer covering the diodes (Di) and the substrate.

8. Device according to claim 1, comprising a buried conducting line between two adjacent columns of diodes or two adjacent rows of diodes at least every k columns (C) and/or m rows (L) of the matrix, k and m being equal to thirty, two or one.

9. Device according to claim 1, wherein each buried conducting line present between two adjacent rows (L) or between two adjacent columns (C) with given lengths, is the same length (λ) as or is longer than the length of said columns (C) or said rows (L).

10. Device according to claim 1, wherein the buried conducting lines have a length (λ) and a width (T) defined in a plane containing the diodes, the width (T) being perpendicular to the length (λ) and being between about 0.5 μm and 5 μm.

11. Device according to claim 1, wherein the thickness (H) of the buried conducting lines defined approximately along a normal to a plane containing the diodes (Di), is between about 0.5 μm and 2 μm.

12. Device according claim 1, wherein the buried conducting lines have no direct electrical connection with any diode in the matrix at a diode contact or at the second doped zones.

* * * * *